(12) United States Patent
Tian et al.

(10) Patent No.: US 12,267,976 B2
(45) Date of Patent: Apr. 1, 2025

(54) CHASSIS EAR APPARATUS AND MOUNTING METHOD THEREOF

(71) Applicant: SUZHOU METABRAIN INTELLIGENT TECHNOLOGY CO., LTD., Jiangsu (CN)

(72) Inventors: Hui Tian, Jiangsu (CN); Yu Zou, Jiangsu (CN); Yunwu Peng, Jiangsu (CN)

(73) Assignee: SUZHOU METABRAIN INTELLIGENT TECHNOLOGY CO., LTD., Jiangsu (CN)

( * ) Notice: Subject to any disclaimer, the term of this patent is extended or adjusted under 35 U.S.C. 154(b) by 0 days.

(21) Appl. No.: 18/571,188

(22) PCT Filed: May 26, 2022

(86) PCT No.: PCT/CN2022/095375
§ 371 (c)(1),
(2) Date: Dec. 15, 2023

(87) PCT Pub. No.: WO2023/130647
PCT Pub. Date: Jul. 13, 2023

(65) Prior Publication Data
US 2024/0284626 A1     Aug. 22, 2024

(30) Foreign Application Priority Data
Jan. 5, 2022   (CN) .......................... 202210002558.8

(51) Int. Cl.
*G06F 1/16*     (2006.01)
*H05K 5/00*    (2006.01)
(Continued)

(52) U.S. Cl.
CPC ......... *H05K 7/1417* (2013.01); *H05K 7/1494* (2013.01)

(58) Field of Classification Search
CPC ...... H05K 7/1417; H05K 7/1494; H05K 7/14; H05K 7/1422; H05K 7/1427
See application file for complete search history.

(56) References Cited

U.S. PATENT DOCUMENTS 4,399,487 A * 8/1983 Neumann ................ H05K 7/14
                                                  361/752
4,503,484 A * 3/1985 Moxon ................ H05K 7/1441
                                                  361/736
(Continued)

FOREIGN PATENT DOCUMENTS

CN      106900160 A     6/2017
CN      109699145 A     4/2019
(Continued)

OTHER PUBLICATIONS

Chinese Search Report issued for Chinese Patent Appl. No. 202210002558.8, 2 pgs.
(Continued)

*Primary Examiner* — Anthony M Haughton
(74) *Attorney, Agent, or Firm* — Merchant & Gould P.C.

(57) ABSTRACT

Provided are a chassis ear apparatus and a mounting method thereof. The chassis ear apparatus includes a shell, wherein a chassis ear seat is detachably mounted on a back surface of the shell, and the chassis ear seat is configured to be fixed to a rack after a server is installed into the rack; a printed circuit board is arranged at a front surface of the shell, the printed circuit board is installed from the front surface of the shell and is detachably mounted on the chassis ear seat, and the printed circuit board is connected to a mainboard inside the server via a signal cable; and the signal cable penetrates through a gap between the shell and the chassis ear seat and is inserted into a cable socket on a front surface of the printed circuit board from the front surface of the shell.

20 Claims, 10 Drawing Sheets

(51) Int. Cl.
    *H05K 7/00*        (2006.01)
    *H05K 7/14*        (2006.01)

(56)            References Cited

U.S. PATENT DOCUMENTS 5,159,534  A  * 10/1992  Hudson ................ H05K 7/1439
                                                        361/736
    6,185,092  B1 *  2/2001  Landrum ............. H05K 7/1494
                                                        361/679.21
    9,668,371  B1 *  5/2017  Strmiska .............. H05K 7/1489
   10,314,195  B1 *  6/2019  Xu ........................ H05K 7/1417
   10,330,299  B1 *  6/2019  Ivey ....................... H05K 7/183
 2013/0229775  A1 *  9/2013  Crisp ..................... G06F 1/181
                                                        361/725
 2018/0070469  A1 *  3/2018  Hofmann ............. H05K 7/1489
 2019/0246510  A1 *  8/2019  Wood ................... H05K 5/0204
 2019/0280416  A1    9/2019  Zhang
 2019/0286197  A1 *  9/2019  Khan ........................ G06F 1/20
 2024/0013815  A1 *  1/2024  George ............. G11B 33/0466

FOREIGN PATENT DOCUMENTS

CN          209560430  U      10/2019
    CN          210721259  U       6/2020
    CN          211956360  U      11/2020
    CN          213546476  U       6/2021
    CN          215010940  U      12/2021
    CN          114025554  A       2/2022
    JP         2011248560  A      12/2011

OTHER PUBLICATIONS

International Search Report for International Patent Appl. No. PCT/CN2022/095375 mailed Oct. 9, 2022, 10 pgs.

* cited by examiner

CHASSIS EAR APPARATUS AND MOUNTING METHOD THEREOF

CROSS-REFERENCE TO RELATED APPLICATION

This application is a National Stage Application of PCT/CN2022/095375, filed May 26, 2022, which claims priority to Chinese Patent Application No. 202210002558.8, filed Jan. 5, 2022 in China, and which applications are incorporated herein by reference. To the extent appropriate, a claim of priority is made to each of the above-disclosed applications.

TECHNICAL FIELD

The present disclosure relates to the field of data processing devices, and in particular to a chassis ear apparatus and a mounting method thereof.

BACKGROUND

At present, a chassis of a rack-mounted server is typically provided with intelligent chassis ears (sometimes also referred to as multifunctional rack mount ears) for implementing functions such as power on/off and status indication. These functions are implemented by a printed circuit board mounted inside the chassis ear. The printed circuit board is connected to a mainboard inside the chassis via a signal cable, so as to achieve power and signal connections.

At present, a common manner of fixing a chassis ear of the rack-mounted server is to secure a back surface of the chassis ear to the chassis by using screws. After the server is mounted in a rack, if the printed circuit board inside the chassis ear fails and needs to be replaced, the whole server is removed from the rack, the screws are disassembled from the back surface of the chassis ear, and then the printed circuit board inside the chassis ear is replaced. The maintenance process is complicated, and the server needs to be removed from the rack to cause service interruption.

SUMMARY

According to some embodiments, the present disclosure provides a chassis ear apparatus, which includes a shell. A chassis ear seat is detachably mounted on a back surface of the shell, and the chassis ear seat is configured to be fixed to a rack after a server is installed into the rack. A printed circuit board is arranged at a front surface of the shell, the printed circuit board is installed from the front surface of the shell and is detachably mounted on the chassis ear seat, and the printed circuit board is connected to a mainboard in the server via a cable. The cable penetrates through a gap between the shell and the chassis ear seat and is inserted into a cable socket on a front surface of the printed circuit board from the front surface of the shell.

In some embodiments, at least one self-clinching standoff is arranged on a front surface of the chassis ear seat, and the printed circuit board is installed from the front surface of the shell and then is detachably mounted on the chassis ear seat through threaded connection between set screws and the self-clinching standoff.

In some embodiments, a maintenance window for mounting and removing of the printed circuit board is arranged on the front surface of the shell, and a sealing cover plate is arranged at a position of the maintenance window on the front surface of the shell.

In some embodiments, one end of the sealing cover plate is in shaft connection with the shell and is able to rotate around a rotating shaft to open or close the maintenance window on the shell.

In some embodiments, a locking structure is arranged on the front surface of the shell, the locking structure locks the sealing cover plate when the sealing cover plate rotates to close the maintenance window, and when the locking structure unlocks the sealing cover plate, the sealing cover plate is able to rotate to open the maintenance window.

In some embodiments, the locking structure includes a locking part that is arranged on the shell and is able to reciprocate, and a locking groove matching with the locking part is arranged on a free end of the sealing cover plate, and the locking part moves to be inserted into the locking groove to lock the sealing cover plate (5) when the sealing cover plate rotates to close the maintenance window on the shell.

In some embodiments, a mounting area for reciprocating movement of the locking part is arranged inside the shell, the mounting area is provided with a channel communicating with the maintenance window, and an end of the locking part extends into the maintenance window from the channel.

In some embodiments, an inclined force application surface is arranged on the free end of the sealing cover plate, the locking part is provided with an inclined stress surface in contact fit with the inclined force application surface, the inclined force application surface extrudes the inclined stress surface to move the end of the locking part into the channel. An elastic piece is further arranged in the mounting area, the elastic piece elastically abuts against the locking part, and the locking part automatically moves out under elastic force of the elastic piece and inserts into the locking groove.

In some embodiments, a waist type hole communicating with the mounting area is formed at the front surface of the shell, an extension direction of the waist type hole is consistent with a direction of the reciprocating movement of the locking part, an unlocking part is arranged on a side surface of the locking part, and the unlocking part protrudes out of the waist type hole.

According to some embodiments, the present disclosure further provides a mounting method for a chassis ear apparatus, applied to the above chassis ear apparatus. The mounting method includes the following operations: routing a signal cable to pass through the back surface of the shell to the front surface of the shell; fixing the chassis ear seat to the shell by using screws, wherein the screws are fixed from the back surface of the chassis ear seat; and fixing the printed circuit board from the front surface of the shell by using set screws, and inserting the signal cable into the cable socket of the printed circuit board.

BRIEF DESCRIPTION OF THE DRAWINGS

In order to more clearly illustrate the technical solutions in the embodiments of the present disclosure or the related art, the drawings used in the embodiments will be briefly described below.

It is apparent that the drawings described below are only some embodiments of the present disclosure. Other drawings may further be obtained by those having ordinary skill in the art according to these drawings without creative efforts.

DETAILED DESCRIPTION

In order to make the objectives, technical solutions, and advantages of the embodiments of the present disclosure clearer, the embodiments of the present disclosure will be described below in detail in combination with the drawings. However, those having ordinary skill in the art should understand that that many technical details are set forth in order to enable the reader to better understand the present disclosure in the embodiments of the present disclosure. The claimed technical solutions in the present disclosure may also be implemented even without these technical details and various changes and modifications based on the following embodiments. The division of the following embodiments is for convenience of description, and shall not form any limit to the exemplary implementation of the present disclosure. The embodiments may be combined and referred to each other without conflicts.

At present, a common manner of fixing a chassis ear of the rack-mounted server is to secure a back surface of the chassis ear to the chassis by using screws. After the server is mounted in a rack, if the printed circuit board inside the chassis ear fails and needs to be replaced, the whole server is removed from the rack, the screws are disassembled from the back surface of the chassis ear, and then the printed circuit board inside the chassis ear is replaced. The maintenance process is complicated, and the server needs to be removed from the rack to cause service interruption. The maintenance process for the printed circuit board in the chassis ear of the rack-mounted server in the related art includes the following operations: 1) pulling out a chassis from the rack; 2) disassembling set screws of a plastic shell on the back surface of the chassis ear; 3) removing set screws of the printed circuit board; and 4) removing a signal cable.

Figure 1:
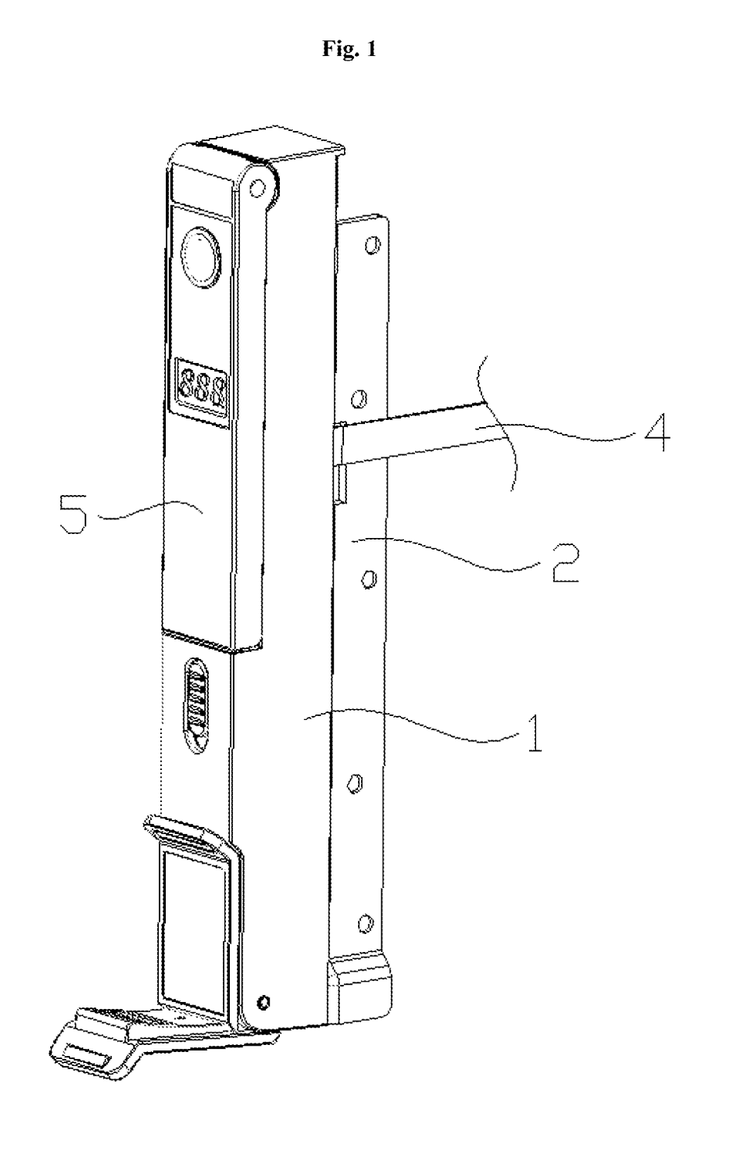
FIG. 1 is a schematic structural diagram when a sealing cover plate in a chassis ear apparatus is closed according to an embodiment of the present disclosure.
Figure 2:
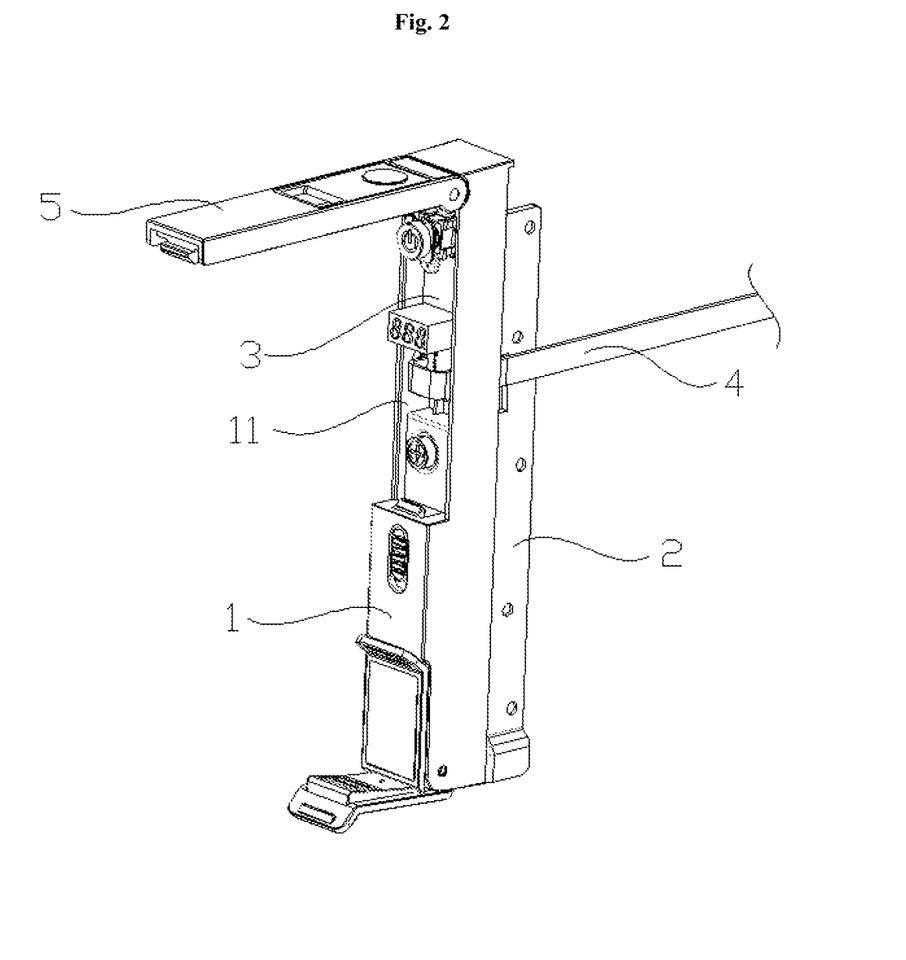
FIG. 2 is a schematic structural diagram when a sealing cover plate in a chassis ear apparatus is opened according to an embodiment of the present disclosure.
Figure 3:
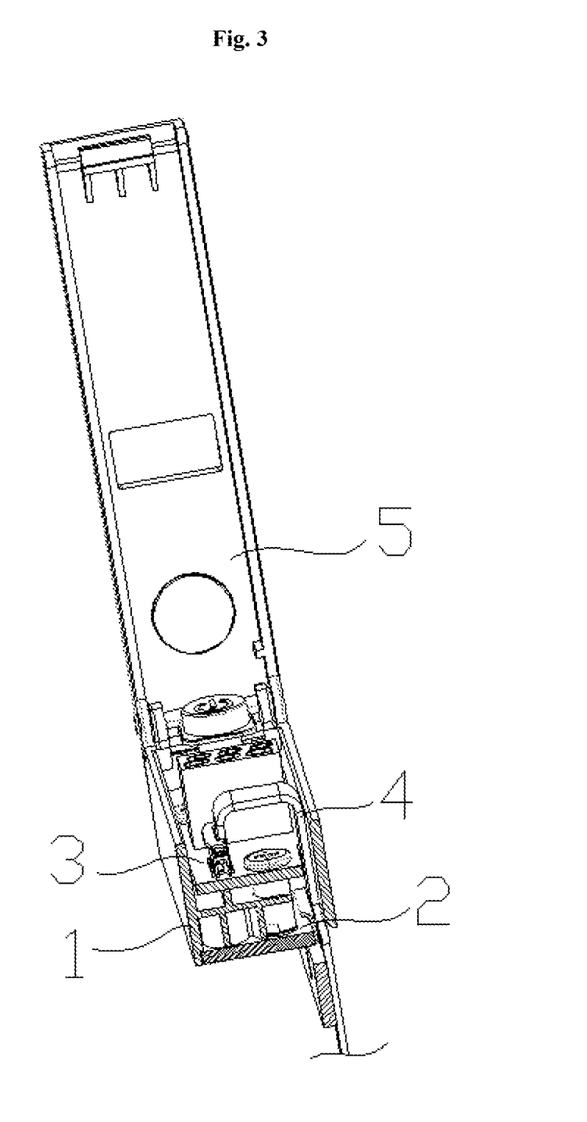
FIG. 3 is a schematic diagram of a section showing how a signal cable penetrates through a gap between a shell and a chassis ear seat in a chassis ear apparatus according to an embodiment of the present disclosure.
Figure 4:
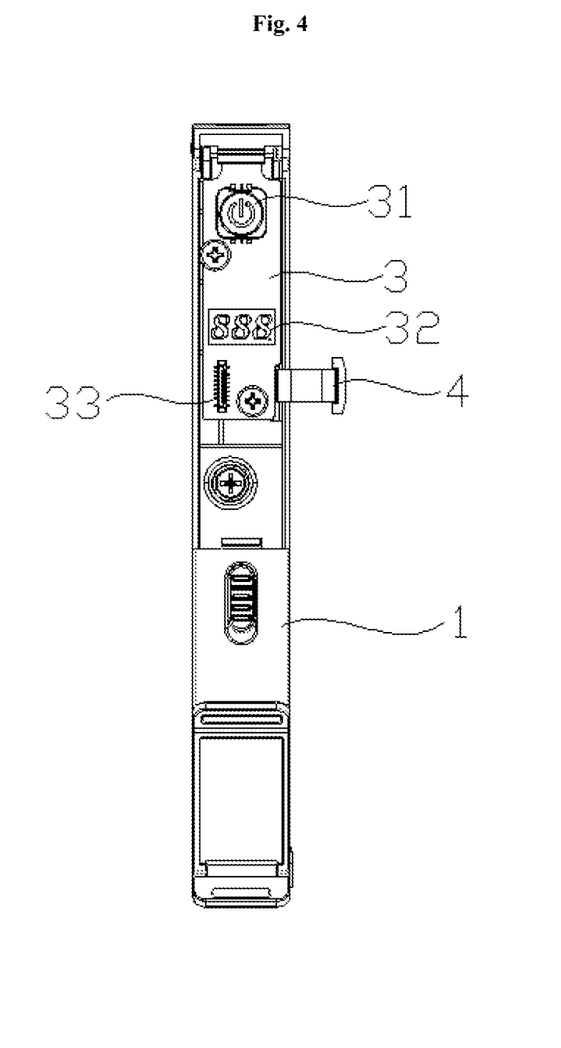
FIG. 4 is a front view of a chassis ear apparatus after a sealing cover plate is omitted according to an embodiment of the present disclosure.

In order to solve the above problems, the embodiments of the present disclosure provide a chassis ear apparatus. Referring to FIG. 1 and FIG. 2, the chassis ear apparatus includes: a shell 1, a chassis ear seat 2, and a printed circuit board 3. The orientations of front surfaces of the shell 1, the chassis ear seat 2, and the printed circuit board 3 are consistent during mounting, so that the front surface of the chassis ear seat 2 and the back surface of the shell 1 are detachably connected, and the printed circuit board 3 is installed from the front surface of the shell 1 to achieve the detachable connection with the front surface of the chassis ear seat 2. Referring to FIG. 3 and FIG. 4, a signal cable 4 penetrates through a gap between the chassis ear seat 2 and a side wall of the shell 1 to the front surface of the shell, and is inserted into a cable socket 33 on the front surface of the printed circuit board 3. After the shell 1, the chassis ear seat 2, and the printed circuit board 3 are assembled, they are fixed to the rack through a back surface of the chassis ear seat 2. In one example, a power button 31, a nixie tube 32, the cable socket 33 for allowing the signal cable 4 to be inserted, etc. are arranged on the printed circuit board 3.

Different from the manner of fixing the chassis ear of the rack-mounted server in the related art, in this solution, the printed circuit board 3 is installed from the front surface of the shell 1, the printed circuit board 3 is then fixed to the chassis ear seat 2, and the signal cable 4 is routed from the back surface of the shell 1 to the front surface and inserted into the cable socket 33 on the front surface of the printed circuit board 3. By disassembling the printed circuit board 3 inside the chassis ear from the front surface of the shell 1, the replacement of the printed circuit board 3 is facilitated, and the problem that the maintenance of the intelligent chassis ear of the rack-mounted server in the related art requires removing the server from the rack to cause service interruption is solved.

Referring to FIG. 2 and FIG. 3, in the embodiment, a maintenance window 11 is arranged on the front surface of the shell 1, and the printed circuit board 3 is installed from the maintenance window 11 and is then mounted on the front surface of the chassis ear seat 2. A sealing cover plate 5 is arranged on the front surface of the shell 1 to close or open the maintenance window 11. By opening the sealing cover plate 5, the printed circuit board 3 located inside the maintenance window 11 is exposed, and the signal cable 4 is pulled out from the cable socket 33 and is moved to the side surface (as shown in FIG. 4), and the printed circuit board 3 is removed from the front surface of the shell 1, so that the printed circuit board 3 inside the chassis ear may be replaced from the front surface of the shell 1 without power-off of the whole machine, thereby avoiding service interruption.

Figure 5:
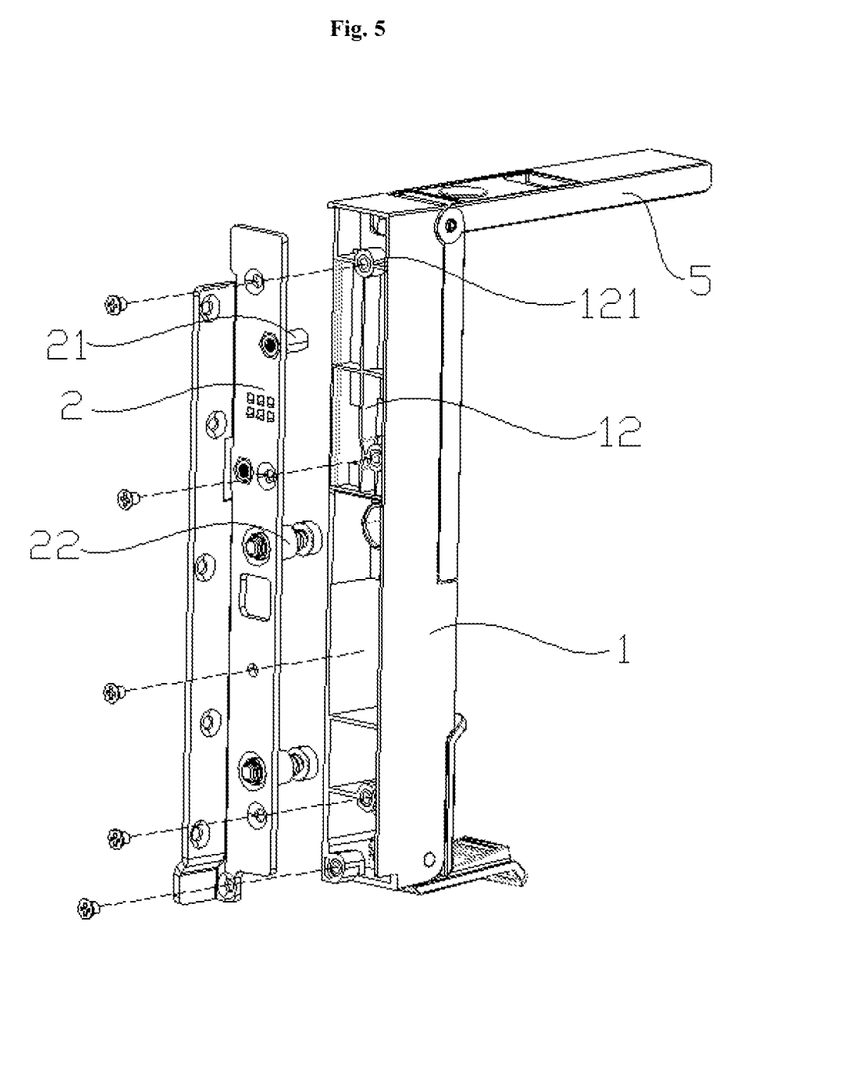
FIG. 5 is an exploded view between a shell and a chassis ear seat in a chassis ear apparatus according to an embodiment of the present disclosure.

Referring to FIG. 5, in the embodiment, the shell 1 may be made of plastic for insulation. The shell 1 is in the shape of a rectangular strip, the back surface of the shell 1 is arranged open and additionally provided with at least one support board 12, at least one threaded column 121 is additionally arranged on the support board 12, and the mounting of the chassis ear seat 2 is supported and fixed by the support board 12. The chassis ear seat 2 may be made of metal, a plurality of fixing holes are formed in the chassis ear seat 2, and the chassis ear seat 2 is in threaded connection with the threaded column 121 on the back surface of the shell 1 through screws that penetrate through the fixing holes, so as to achieve the detachable mounting between the chassis ear seat 2 and the shell 1.

Figure 6:
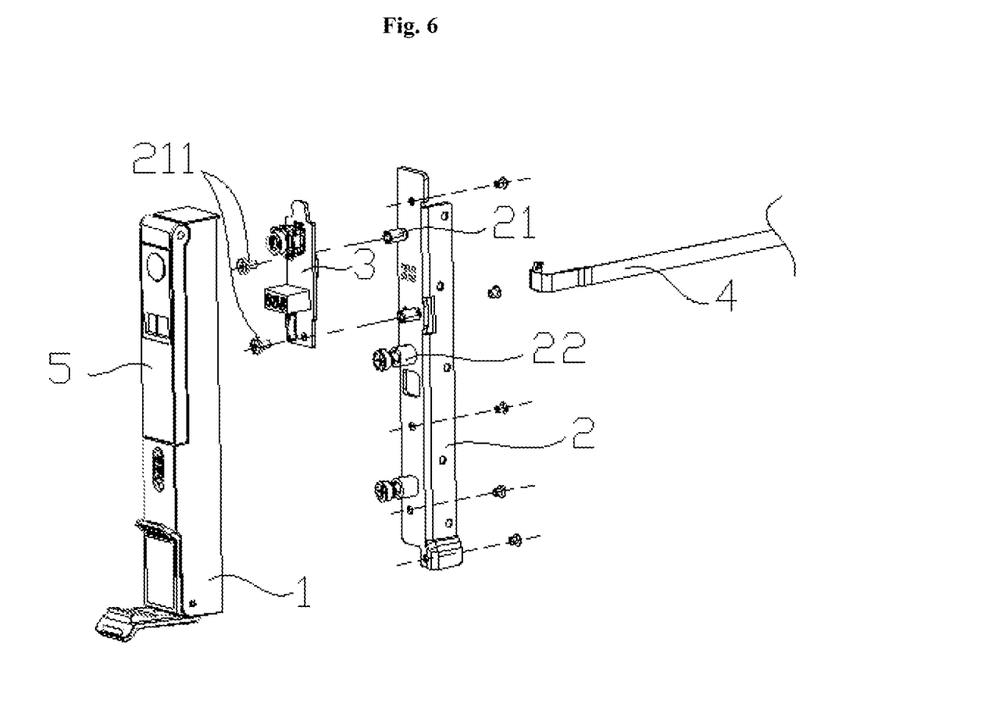
FIG. 6 is an exploded view among a shell, a printed circuit board, a chassis ear seat, and a signal cable in a chassis ear apparatus according to an embodiment of the present disclosure.

Referring to FIG. 5 and FIG. 6, the maintenance window 11 on the front surface of the shell 1 exposes the support board 12, so that the printed circuit board 3 is installed from the position of the maintenance window 11 and attached to the support board 12 to achieve supporting and fixing. In one example, two self-clinching standoffs 21 are arranged on the middle-upper part of the front surface of the chassis ear seat 2, which may be configured to fix the printed circuit board 3 with the cooperation of screws. During the mounting, the front surface of the chassis ear seat 2 is attached to the support board 12 on the back of the shell 1, the self-clinching standoffs 21 penetrates through the support board 12 and extend into the maintenance window 11 on the front surface of the shell 1. The printed circuit board 3 is installed (placed) from the maintenance window 11 on the front surface of the shell 1 to be attached to the self-clinching standoffs 21, and the printed circuit board 3 is threadedly fixed to the self-clinching standoffs 21 by set screws 211, thereby achieving the detachable mounting of the printed circuit board 3.

In the embodiment, two spring screws 22 are arranged on the chassis ear seat 2, one is distributed in the middle of the chassis ear seat 2, and the other is distributed on the lower part of the chassis ear seat 2, both of which are configured to be fixed to the rack after the server is installed into the rack.

Referring to FIG. 2, in some embodiments, one end of the sealing cover plate 5 is in shaft connection with an end of the shell 1 in a length direction, the sealing cover plate 5 rotates around a rotating shaft, and the maintenance window 11 on the shell 1 is opened or closed by rotating the sealing cover plate 5. If the printed circuit board 3 needs to be replaced, the sealing cover plate 5 is opened and rotated to be perpendicular to the front surface of the shell 1. At this time, the sealing cover plate 5 remains still at this position relying on the interference fit with the rotating shaft. After the printed circuit board 3 is replaced, the sealing cover plate 5 is rotated again to close the maintenance window 11.

Figure 7:
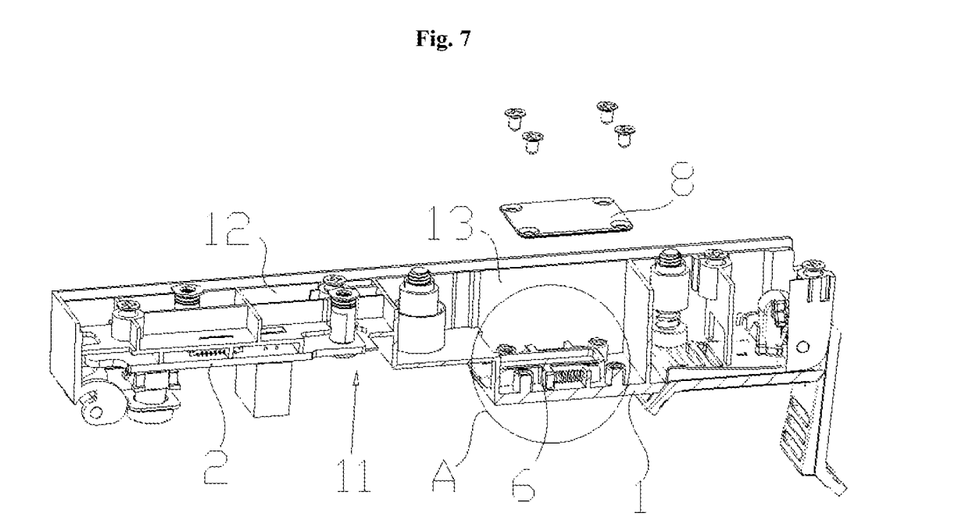
FIG. 7 is a schematic diagram of a section showing the internal structure of a shell in a chassis ear apparatus according to an embodiment of the present disclosure.
Figure 8:
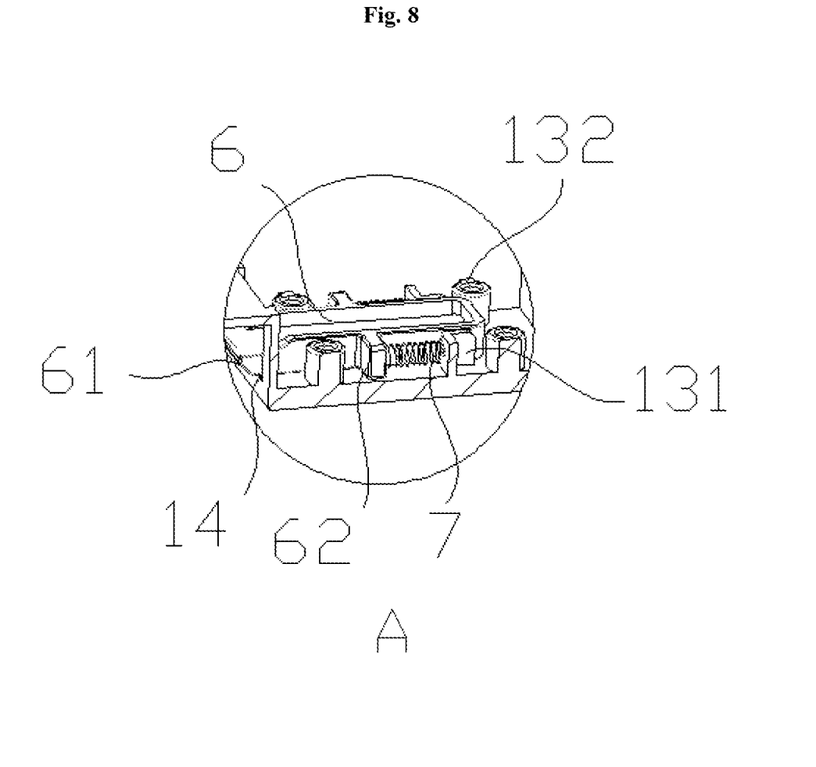
FIG. 8 is an enlarged view at the part A in FIG. 7.

In combination with FIG. 2, FIG. 7 and FIG. 8, in other embodiments, in order to ensure the closing stability of the sealing cover plate 5, a locking structure is additionally arranged in the shell 1. The locking structure is configured to close and open the sealing cover plate 5. When the sealing cover plate 5 is closed, locking is achieved by the locking structure, and when the sealing cover plate 5 needs to be opened, unlocking is achieved by the locking structure. In one example, the locking structure includes a locking part 6. A mounting area 13 adjacent to the maintenance window 11 is further arranged inside the shell 1, the locking part 6 is arranged in the mounting area 13 in a reciprocating manner, a channel 14 communicating with the maintenance window 11 is arranged on the mounting area 13, and when the locking part 6 moves forward through the channel 14, an insertion end of the locking part 6 is guided into the maintenance window 11 through the channel 14.

Figure 9:
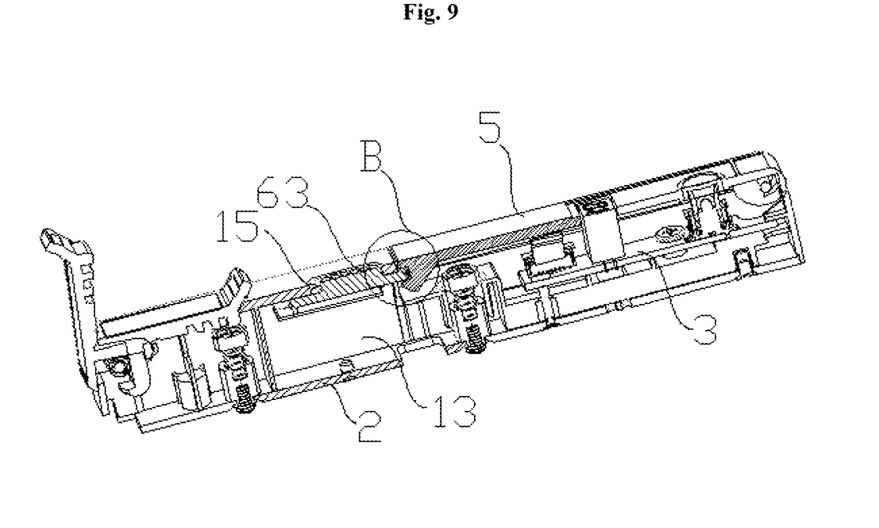
FIG. 9 is a schematic diagram of another section showing the internal structure of a shell in a chassis ear apparatus according to an embodiment of the present disclosure.
Figure 10:
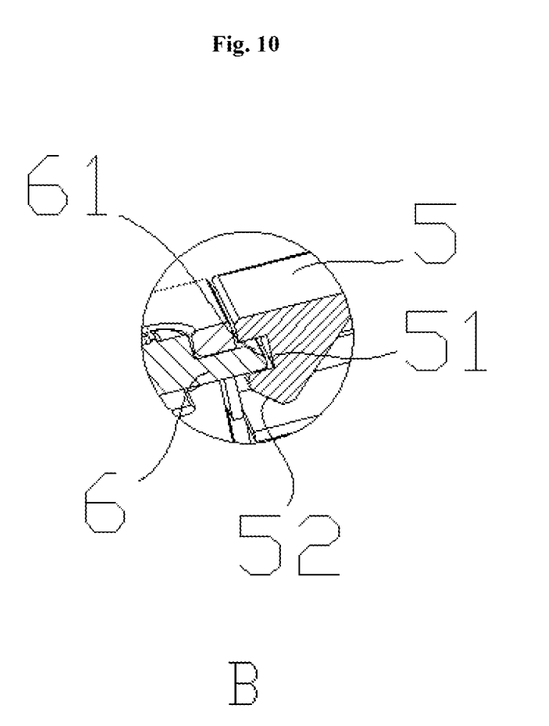
FIG. 10 is an enlarged view at the part B in FIG. 9.

Referring to FIG. 9 and FIG. 10, a locking groove 51 is arranged on a free end of the sealing cover plate 5, and the locking groove 51 is adapted to the locking end of the locking part 6. When the sealing cover plate 5 is closed to be in contact with the shell 1, through moving the locking part 6, the locking end of the locking part 6 exposes from the channel 14 and inserts into the locking groove 51 in the sealing cover plate 5, thereby locking the sealing cover plate 5.

Referring to FIG. 8 and FIG. 10, in an example, an inclined force application surface 52 is arranged on an end of the free end of the sealing cover plate 5, and an inclined stress surface 61 is arranged on the locking end of the locking part 6. The inclined stress surface 61 and the inclined force application surface 52 are in contact fit with each other to form slope wedge sliding. During the closing of the sealing cover plate 5, the inclined force application surface 52 is first in contact with the inclined stress surface 61, through the extrusion of the inclined force application surface 52 on the inclined stress surface 61, the locking part 6 moves back to cause the locking end to retract to the channel 14 until the inclined force application surface 52 and the inclined stress surface 61 are separated from each other, and at this time, the sealing cover plate 5 is closed to be flush with respect to the shell 1.

In order to facilitate the locking part 6 to automatically move forward to enable the locking end to insert into the locking groove 51 to achieve the locking after the inclined stress surface 61 and the inclined force application surface 52 are separated, an elastic piece is further arranged in the mounting area 13, and the elastic piece is configured to enable the locking part 6 to automatically move forward when the inclined force application surface 52 and the inclined stress surface 61 are separated. Two opposite and spaced abutting blocks 131 are arranged in the mounting area 13, the locking part 6 reciprocates between the two abutting blocks 131, mounting blocks 62 matched with the abutting blocks 131 are arranged on the locking part 6, and elastic pieces are connected between the abutting blocks 131 and the mounting blocks 62. In the process of moving back, the locking part 6 exerts extrusion pressure on the elastic piece through the mounting block 62, so as to deform the elastic piece. When the inclined force application surface 52 and the inclined stress surface 61 are separated, the elastic piece recovers deformation and pushes the locking part 6 forward. Preferably, the elastic piece is a compression spring 7.

Referring to FIG. 7 and FIG. 8, four fixing columns 132 are further fixed in the mounting area 13, the four fixing columns 132 are distributed in a rectangular manner, the locking part 6 is arranged among the four fixing columns 132, and the abutting blocks 131 and the mounting blocks 62 are located in an area enclosed by the four fixing columns 132. A fixed cover 8 is arranged on the fixing columns 132, and the fixed cover 8 stabilizes the locking part 6 between the fixed cover 8 and the bottom of the mounting area 13, so that the locking part 6 moves stably along a specific moving path.

Referring to FIG. 7 and FIG. 9, a waist type hole 15 communicating with the mounting area 13 is further formed at the front surface of the shell 1, a length direction of the waist type hole 15 is consistent with a direction of movement of the locking part 6, an unlocking part 63 is arranged on a side surface, facing the waist type hole 15, of the locking part 6, the unlocking part 63 protrudes from the waist type hole 15, anti-slip lines are arranged on the unlocking part 63, and the locking part 6 is controlled to move in the mounting area 13 by the unlocking part 63.

The principle of the embodiments is as follows: when the printed circuit board 3 needs to be replaced, the unlocking part 63 moves backward through manual sliding of the unlocking part 63, and then the locking end of the locking part 6 is driven to be separated from the locking groove 51 of the sealing cover plate 5. At this time, the sealing cover plate 5 is opened and rotates to be perpendicular to the front surface of the shell 1. At this time, the sealing cover plate 5 remains still at the position relying on the interference fit with the rotating shaft. The signal cable 4 located on the printed circuit board 3 is pulled out, a cable end of the signal cable 4 is moved to the side surface, the set screws 211 are disassembled by using a screwdriver and the printed circuit board 3 is removed, reverse operations of the above operations are performed to install a new printed circuit board 3, the set screws 211 are fastened, and the signal cable 4 is inserted into the cable socket.

When the sealing cover plate 5 needs to be closed, the sealing cover plate 5 is rotated, so that the inclined force application surface 52 on the end of the sealing cover plate 5 is in contact with the inclined stress surface 61 of the locking part 6, upon extrusion, the locking part 6 moves backward under the extrusion pressure until the inclined force application surface 52 and the inclined stress surface 61 are separated. At this time, the sealing cover plate 5 is flush with the shell 1, and the locking part 6 is pushed into the locking groove 51 of the sealing cover plate 5 by the inside compression spring 7 so as to fix the sealing cover plate 5. Of course, it is also possible to manually slide the unlocking part 63 backward from the front surface and press the sealing cover plate 5 to be flush with the shell 1, the unlocking part 63 is released, and then the sealing cover plate 5 is fixed.

The chassis ear apparatus provided by the embodiments of the present disclosure has at least the following advantages.

(1) The printed circuit board is fixed from the front surface of the shell, in a case of failure and need for replacement, it is not necessary to remove the whole chassis from the rack, and only the sealing cover plate is opened, the printed circuit board is removed from a maintenance opening of the shell, and only a few tools are used to operate from the front surface of the shell, thereby achieving the detachable mounting.

(2) Through the rotary of the sealing cover plate and the arrangement of the locking structure, the operation is easy and the use is reliable.

The embodiments of the present disclosure further provide a mounting method for a chassis ear apparatus, applied to the above chassis ear apparatus, including the following operations S1 to S3.

At S1, a signal cable 4 is routed to pass through the back surface of the shell 1 to the front surface of the shell 1.

At S2, the chassis ear seat 2 is fixed to the shell 1 by using screws, wherein the screws are fixed from the back surface of the chassis ear seat 2.

At S3, the printed circuit board 3 is fixed from the front surface of the shell 1 by using set screws 211, and the signal cable 4 is inserted into the cable socket 33 of the printed circuit board 3.

It should be understood that the above exemplary implementations of the present disclosure are used only for exemplary illustration or to illustrate the principle of the present disclosure and do not constitute limitations to the present disclosure. Therefore, any modifications, equivalent substitutions, improvements, etc. made without departing from the principle and scope of the present disclosure should be included within the scope of protection of the present disclosure. In addition, the appended claims of the present disclosure are intended to cover all changes and modifications that fall within the scope and boundaries of the appended claims, or equivalent forms of the scope and boundaries.

A list of reference signs is as follows.
1. Shell;
11. Maintenance window;
12. Support board;
121. Threaded column;
13. Mounting area;
131. Abutting block;
132. Fixing column;
14. Channel;
15. Waist type hole;
2. Chassis ear seat;
21. Self-clinching standoff;
211. Set screw;
22. Spring screw;
3. Printed circuit board;
31. Power button;
32. Nixie tube;
33. Cable socket;
4. Signal cable;
5. Sealing cover plate;
51. Locking groove;
52. Inclined force application surface;
6. Locking part;
61. Inclined stress surface;
62. Mounting block;
63. Unlocking part;
7. Spring; and
8. Fixed cover.

What is claimed is:

1. A chassis ear apparatus, comprising:
a shell, wherein a chassis ear seat is detachably mounted on a back surface of the shell, and the chassis ear seat is configured to be fixed to a rack after a server is installed into the rack;
wherein a printed circuit board is arranged at a front surface of the shell, the printed circuit board is installed from the front surface of the shell and is detachably mounted on the chassis ear seat, and the printed circuit board is connected to a mainboard inside the server via a signal cable; and
the signal cable penetrates through a gap between the shell and the chassis ear seat and is inserted into a cable socket on a front surface of the printed circuit board from the front surface of the shell.

2. The chassis ear apparatus according to claim 1, wherein at least one self-clinching standoff is arranged on a front surface of the chassis ear seat, and the printed circuit board is installed from the front surface of the shell and then is detachably mounted on the chassis ear seat through threaded connection between set screws and the self-clinching standoff.

3. The chassis ear apparatus according to claim 2, wherein a maintenance window for mounting and removing of the printed circuit board is arranged on the front surface of the shell, and a sealing cover plate is arranged at a position of the maintenance window on the front surface of the shell.

4. The chassis ear apparatus according to claim 3, wherein one end of the sealing cover plate is in shaft connection with the shell and is able to rotate around a rotating shaft to open or close the maintenance window on the shell.

5. The chassis ear apparatus according to claim 4, wherein a locking structure is arranged on the front surface of the shell, the locking structure locks the sealing cover plate when the sealing cover plate rotates to close the maintenance window, and when the locking structure unlocks the sealing cover plate, the sealing cover plate is able to rotate to open the maintenance window.

6. The chassis ear apparatus according to claim 5, wherein the locking structure comprises a locking part that is arranged on the shell and is able to reciprocate, wherein a locking groove matching with the locking part is arranged on a free end of the sealing cover plate, and the locking part moves to be inserted into the locking groove to lock the sealing cover plate when the sealing cover plate rotates to close the maintenance window on the shell.

7. The chassis ear apparatus according to claim 6, wherein a mounting area for reciprocating movement of the locking part is arranged inside the shell, the mounting area is provided with a channel communicating with the maintenance window, and an end of the locking part extends into the maintenance window from the channel.

8. The chassis ear apparatus according to claim 7, wherein an inclined force application surface is arranged on the free end of the sealing cover plate, the locking part is provided with an inclined stress surface in contact fit with the inclined force application surface, and the inclined force application surface extrudes the inclined stress surface to move the end of the locking part into the channel; and an elastic piece is further arranged in the mounting area, the elastic piece elastically abuts against the locking part, and the locking part automatically moves out under elastic force of the elastic piece and inserts into the locking groove.

9. The chassis ear apparatus according to claim 8, wherein a waist type hole communicating with the mounting area is formed at the front surface of the shell, an extension direction of the waist type hole is consistent with a direction of the reciprocating movement of the locking part, an unlocking part is arranged on a side surface of the locking part, and the unlocking part protrudes out of the waist type hole.

10. The chassis ear apparatus according to claim 1, wherein the back surface of the shell is arranged open and additionally provided with at least one support board, at least one threaded column is additionally arranged on the support board, and the mounting of the chassis ear seat is supported and fixed by the support board.

11. The chassis ear apparatus according to claim 10, wherein the chassis ear seat is made of metal, a plurality of fixing holes are formed in the chassis ear seat, and the chassis ear seat is in threaded connection with the threaded column on the back surface of the shell through screws that penetrate through the fixing holes, so as to achieve the detachable mounting between the chassis ear seat and the shell.

12. The chassis ear apparatus according to claim 4, wherein when the sealing cover plate is rotated to be perpendicular to the front surface of the shell and opens the maintenance window on the shell, the sealing cover plate remains still at a position of being perpendicular to the front surface of the shell relying on interference fit with the rotating shaft.

13. The chassis ear apparatus according to claim 7, wherein the mounting area is arranged adjacent to the maintenance window.

14. The chassis ear apparatus according to claim 7, wherein when the sealing cover plate is closed to be in contact with the shell, through moving the locking part, the locking end of the locking part exposes from the channel and inserts into the locking groove in the sealing cover plate, thereby locking the sealing cover plate.

15. The chassis ear apparatus according to claim 8, wherein an elastic piece is further arranged in the mounting area, and the elastic piece is configured to enable the locking part to automatically move forward when the inclined force application surface and the inclined stress surface are separated.

16. The chassis ear apparatus according to claim 15, wherein two opposite and spaced abutting blocks are arranged in the mounting area, the locking part reciprocates between the two abutting blocks, mounting blocks matched with the abutting blocks are arranged on the locking part, and elastic pieces are connected between the abutting blocks and the mounting blocks.

17. The chassis ear apparatus according to claim 16, wherein four fixing columns are further fixed in the mounting area, the four fixing columns are distributed in a rectangular manner, the locking part is arranged among the four fixing columns, and the abutting blocks and the mounting blocks are located in an area enclosed by the four fixing columns.

18. The chassis ear apparatus according to claim 17, wherein a fixed cover is arranged on the fixing columns, and the fixed cover stabilizes the locking part between the fixed cover and the bottom of the mounting area, so that the locking part moves stably along a specific moving path.

19. A mounting method for a chassis ear apparatus, wherein the chassis ear apparatus comprises a shell, wherein a chassis ear seat is detachably mounted on a back surface of the shell, and the chassis ear seat is configured to be fixed to a rack after a server is installed into the rack; wherein a printed circuit board is arranged at a front surface of the shell, the printed circuit board is installed from the front surface of the shell and is detachably mounted on the chassis ear seat, and the printed circuit board is connected to a mainboard inside the server via a signal cable; and the signal cable penetrates through a gap between the shell and the chassis ear seat and is inserted into a cable socket on a front surface of the printed circuit board from the front surface of the shell, the mounting method comprising the following operations:
  routing the signal cable to pass through the back surface of the shell to the front surface of the shell;
  fixing the chassis ear seat to the shell by using screws, wherein the screws are fixed from the back surface of the chassis ear seat; and
  fixing the printed circuit board from the front surface of the shell by using the set screws, and inserting the signal cable into the cable socket of the printed circuit board.

20. A method for removing a printed circuit board from a chassis ear apparatus, wherein the chassis ear apparatus comprises a shell, wherein a chassis ear seat is detachably mounted on a back surface of the shell, and the chassis ear seat is configured to be fixed to a rack after a server is installed into the rack; wherein the printed circuit board is arranged at a front surface of the shell, the printed circuit board is installed from the front surface of the shell and is detachably mounted on the chassis ear seat, and the printed circuit board is connected to a mainboard inside the server via a signal cable; and the signal cable penetrates through a gap between the shell and the chassis ear seat and is inserted into a cable socket on a front surface of the printed circuit board from the front surface of the shell, the method comprising:
  pulling out the signal cable from the cable socket from the front surface of the shell, and moving the signal cable to a side surface of the shell; and
  removing the printed circuit board from the front surface of the shell.

* * * * *